United States Patent

Murai et al.

[11] Patent Number: 5,853,862
[45] Date of Patent: Dec. 29, 1998

[54] BARRIER COMPOSITE FILMS AND METHOD OF PRODUCING THE SAME

[75] Inventors: Takaaki Murai, Otake; Ryuta Miyake, Amagasaki, both of Japan

[73] Assignee: Daicel Chemical Industries, Ltd., Osaka, Japan

[21] Appl. No.: 737,557

[22] PCT Filed: Apr. 11, 1996

[86] PCT No.: PCT/JP96/00990

§ 371 Date: Nov. 12, 1996

§ 102(e) Date: Nov. 12, 1996

[87] PCT Pub. No.: WO96/32253

PCT Pub. Date: Oct. 17, 1996

[30] Foreign Application Priority Data

Apr. 11, 1995 [JP] Japan .................................. 7-111297

[51] Int. Cl.$^6$ .................................................. B32B 15/08
[52] U.S. Cl. ........................ 428/215; 428/216; 428/423.5; 428/423.7; 428/424.2; 428/451; 428/458; 427/412.1; 427/412.5; 427/419.2
[58] Field of Search ................... 428/35.2, 35.4, 428/35.8, 36.6, 213, 215, 216, 446, 448, 447, 458, 423.7, 423.5, 424.2, 451; 427/419.2, 384, 412.1, 412.5

[56] References Cited

U.S. PATENT DOCUMENTS 5,100,720  3/1992  Sawada et al. ........................ 428/215

FOREIGN PATENT DOCUMENTS

| | | |
|---|---|---|
| 53-12953 | 2/1978 | Japan . |
| 60-27532 | 2/1985 | Japan . |
| 63-237940 | 10/1988 | Japan . |
| 1202435 | 8/1989 | Japan . |
| 1202436 | 8/1989 | Japan . |
| 1297237 | 11/1989 | Japan . |
| 3 86539 | 4/1991 | Japan . |
| 3-278946 | 12/1991 | Japan . |
| 4-147857 | 5/1992 | Japan . |
| 4-173137 | 6/1992 | Japan . |
| 6-22976 | 3/1994 | Japan . |
| 8 18395 | 2/1996 | Japan . |

*Primary Examiner*—Paul J. Thibodeau
*Assistant Examiner*—D Lawrence Tarazano
*Attorney, Agent, or Firm*—Birch, Stewart, Kolasch & Birch, LLP

[57] ABSTRACT

At least one side of a base film is successively covered with an anchor coat layer comprising (A) a chlorine-containing resin e.g. a vinyl chloride-vinyl acetate copolymer, (B) a polyisocyanate compound and (C) a saturated polyester resin having glass transition temperature of $-10°$ C. to $20°$ C. and being substantially unreactive to the polyisocyanate compound, and an inorganic layer such as a silicon oxide. The component (C) includes a noncrystalline saturated polyesters each having a hydroxyl value of 0 to 15 mg KOH/g or acid value of 0 to 10 mg KOH/g. The anchor coat layer may comprise about 10 to 500 parts by weight of the component (B) and 1 to 50 parts by weight of the component (C) relative to 100 parts by weight of the component (A). Such composite film inhibits deterioration of the adhesive properties and barrier properties even when exposed to severe conditions such as retort treatment.

20 Claims, No Drawings

1

BARRIER COMPOSITE FILMS AND METHOD OF PRODUCING THE SAME

TECHNICAL FIELD

The present invention relates to a barrier composite film having improved barrier properties typically with respect to water vapor, oxygen gas and aroma or fragrance component and being, therefore, suitable for use as a film for preservation of a dried food, a film for the retort treatment or microwave heating of food or a packaging film for pharmaceutical products and precision electronic devices, films for production of a balloon or fly balloon, among other applications, and a method for producing the film.

BACKGROUND TECHNOLOGY

Coating of a base film with an extremely thin layer of an inorganic oxide insures remarkable improvement of barrier properties of the base film and hence provides a broader choice for the base film in relation with the heat resistance, mechanical characteristics or other characteristics. The composite films each having a thin layer of an inorganic oxide can roughly be classified into the following categories.

(i) A composite film having an inorganic oxide thin layer formed directly on a base film By way of illustration, Japanese Patent Application Laid-open No. 27532/1985 (JP-A-60-27532) discloses a composite film produced by depositing a transparent thin layer of a magnesium oxide on a polyolefinic film and forming a polymer layer on the thin layer by dry-laminating or extrusion-laminating. Japanese Patent Application Laid-open No. 202435/1989 (JP-A-1-202435) and Japanese Patent Application Laid-open No. 202436/1989 (JP-A-1-202436) each discloses a packaging material for microwave cooker use or retort processing which comprises a base film supporting a vapor-deposited silicon oxide layer and either a heat-sealing layer or a protective layer, the heat-sealing layer comprising a heat-sealing resin film, typically a polypropylene film, as laminated, while the protective layer comprising a film as laminated or a thermosetting resin layer as coated. Japanese Patent Application Laid-open No. 297237/1989 (JP-A-1-297237) discloses lamination of a film carrying an inorganic oxide thin layer with a biaxially oriented nylon film, and Japanese Patent Application Laid-open No. 86539/1991 (JP-A-3-86539) discloses laminating or coating of a film supporting an inorganic oxide thin layer with a vinylidene chloride-based resin, for example.

These composite films (i) are, however, liable to be fluctuated in barrier properties or other properties and hence can hardly provides excellent barrier properties with stability. Therefore, when such films are used as a film for retort treatment application which is subjected to a sterilization treatment in an autoclave for steam sealing at a temperature of not lower than 100° C., characteristics of the film such as adhesion (adhesive properties) between layers or barrier properties after retort treatment are remarkably sacrificed. Further, when the inorganic oxide layer is formed directly on the base film, the resultant composite film is apt to curl so that handling properties in processing steps are deteriorated.

(ii) Composite film having an inorganic oxide thin layer formed on a pretreated surface of a base film For instance, Japanese Patent Application Laid-open No. 12953/1978 (JP-A-53-12953) discloses a composite film which comprises a base film and a silicon oxide thin layer with transparency formed on a pretreated surface of the base film, and Japanese Patent Application Laid-open No. 237940/1988 (JP-A-63-237940) discloses a composite film comprising typically an indium oxide or tin oxide-sputtered film carrying a heat-sealing layer typically composed of an ethylene-propylene copolymer.

However, when the composite film (ii) is employed as a film for retort treatment application, adhesion between the base film and the inorganic oxide thin layer is significantly decreased and barrier properties are remarkably sacrificed.

(iii) Composite film having a resin layer or undercoat layer formed on a base film, and an inorganic oxide thin layer formed on the undercoat layer.

By way of an example, Japanese Patent Application Laid-open No. 173137/1992 (JP-A-4-173137) discloses a laminate for a balloon having a high barrier property for helium and hydrogen gas as produced by forming an under coat layer formed on a film, an inorganic oxide thin layer on the undercoat layer, and applying, to the thin layer, a vinyl chloride-vinyl acetate copolymer, a polyamide, a polyester or an acrylic resin or a hot-melt coating composition.

Japanese Patent Application Laid-open No. 86539/1991 (JP-A-3-86539) discloses a production of a film for packaging having a retort treatment quality by applying or coating a two-component curable resin composition having a reactivity and comprising a polyisocyanate compound and a saturated polyester polyol on the surface of a base film, and depositing a silicon oxide thin layer on the coated surface.

Further, Japanese Patent Publication No. 18395/1996 (JP-B-8-18395) discloses a deposited film as produced by forming a mixture layer of a two-component curable polyurethane and 5 to 30% by weight of a vinyl chloride-vinyl acetate copolymer on a base film, and depositing a metal oxide layer such as magnesium oxide on the mixture layer. This literature discloses that the reactive two-component curable polyurethane comprising a polyol component and a polyisocyanate compound is used for inhibiting permeation of moisture, and the vinyl chloride-vinyl acetate copolymer is employed for improving adhesion property of the deposited layer.

According to these composite films (iii), adhesion force between the base film and the inorganic oxide thin layer may be improved. However, even being a composite film having high adhesion properties or barrier properties in normal conditions (a film before retort treatment), not only adhesion properties between the base film and the inorganic oxide thin layer but also barrier properties are significantly deteriorated when used as a film for retort treatment. In particular, adhesive properties between the base film and the inorganic oxide thin layer and barrier properties being high level can not be compatible respectively in both of ordinary state (normal conditions) and after-retort treatment. Further, the coated layer of the reactive two-component curable resin composition (a curable resin composition comprising two components) has a stickiness or tackiness so that blocking is liable to occur and hence winding and rewinding of the film is difficult with a sacrificed productivity. Moreover, the polyol component and the polyisocyanate compound have reactivity with each other, the two-component curable polyurethane once prepared can not be used repeatedly and hence can not help being disposed. Accordingly, the undercoat resin composition can not be utilized with a high effectivity.

It is, therefore, an object of the present invention to provide a barrier composite film having remarkably improved adhesive properties between a base film and an inorganic thin layer and significantly enhanced barrier properties, and a method of producing the composite film.

It is another object of the invention to provide a barrier composite film which inhibits decrease of barrier properties with maintaining excellent adhesion properties between a base film and an inorganic thin layer, not only in normal conditions but even on exposure to severe conditions such as retort treatment and microwave heating, and a production method thereof.

A further object of the invention is to provide a barrier composite film which is useful for long-term preservation of packaged items by means of excellent adhesive properties and high barrier properties, and a method of producing such composite film.

It is a yet another object of the invention to provide a barrier composite film which insures effective use of an anchor coat composition and provides a high productivity, and a production method thereof.

Still another object of the invention is to provide a barrier composite film which has excellent transparency and visual accessibility for packaged items and is useful as a packaging film for foods, pharmaceutical products or precision electronic devices, and a method of producing such film.

DISCLOSURE OF THE INVENTION

For the purpose of accomplishing the above-mentioned objects, the inventors of the present invention did much research and, as a result, found that when a specific uncurable anchor coat layer formed on the surface of a base film layer is deposited with a inorganic layer, there can be obtained not only improved adhesion properties of the inorganic layer with respect to the base film but also remarkably enhanced gas barrier properties even after retort treatment. The present invention has been accomplished based on the above findings.

Thus, the barrier composite film of the present invention is a composite film comprising a base film layer, at least one side of which has been covered with an inorganic thin layer through the interposition of an anchor coat layer, wherein the anchor coat layer comprises (A) a chlorine-containing resin, (B) a polyisocyanate compound, and (C) a saturated polyester resin having a glass transition temperature of $-10°$ C. to $20°$ C. and being substantially unreactive with respect to the polyisocyanate compound. In this composite film, the chlorine-containing resin includes vinyl chloride-vinyl acetate-series copolymers and others, and the polyisocyanate compound includes, for example, a compound having at least 2 isocyanate groups per molecule with a molecular weight of 150 to 1,000. The saturated polyester resin may be a noncrystalline saturated polyester having a hydroxyl value of about 0 to 15 mg KOH/g or an acid value of about 0 to 10 mg KOH/g. The proportions of the components of the anchor coat layer are, for instance, about 10 to 500 parts by weight for the polyisocyanate compound (B) and about 1 to 50 parts by weight of the saturated polyester resin (C) relative to 100 parts by weight of the chlorine-containing resin (A).

As the base film layer, there may be mentioned a polypropylene, a poly(alkylene terephthalate), a polyamide, typically speaking, and the inorganic thin layer may be provided by using, for example, any metal selected from among Group 2A elements of Periodic Table, transition elements, Group 2B elements, Group 3B elements, Group 4B elements and Group 6B elements.

The barrier composite film of the invention also includes, for example, (i) a barrier composite film comprising a base film layer, an anchor coat layer formed on at least one surface of the base film layer, and an inorganic oxide thin layer formed on the anchor coat layer, in which the anchor coat layer has an elastic modulus of $0.1 \times 10^1$ to $1 \times 10^3$ N/mm$^2$, and (ii) a barrier composite film comprising a base film layer, an anchor coat layer formed on at least one surface of the base film layer, and an inorganic oxide thin layer formed on the anchor coat layer, in which the peel strength of the anchor coat layer with respect to the base film layer, after retort treatment at $120°$ C. for 30 minutes, is not less than 100 g/15 mm. These composite films also exhibit excellent barrier properties even exposed to severe conditions such as retort treatment.

According to the method of the invention, a barrier composite film can be prepared by forming, on at least one surface of a base film, an anchor coat layer comprising (A) a chlorine-containing resin, (B) a polyisocyanate compound and (C) a saturated polyester resin having a glass transition temperature of $-10°$ C. to $20°$ C. and being substantially unreactive with respect to the polyisocyanate compound, and depositing an inorganic thin layer on the anchor coat layer.

BEST MODE FOR PRACTICING THE INVENTION

[Base film layer]

The polymer used for the formation of the base film layer includes a variety of film-formable polymers, e.g. polyolefins such as polyethylene, an ethylene-ethyl acrylate copolymer, ionomers, polypropylene, an ethylene-propylene copolymer, poly-4-methylpentene-1, etc.; polyesters such as a polyalkylene terephthalate (e.g. polyethylene terephthalate, polybutylene terephthalate), polyethylene-2, 6-naphthalate, etc.; polyamides such as nylon 6, nylon 11, nylon 12, nylon 66, nylon 610, nylon 6/66, nylon 66/610, nylon MXD etc.; polyvinyl chloride; polyvinylidene chloride series resins such as polyvinylidene chloride, vinylidene chloride-vinyl chloride copolymer, vinylidene chloride-acrylonitrile copolymer, vinylidene chloride-(meth)acrylate copolymer, etc.; styrenic resins such as polystyrene, styrene-acrylonitrile copolymer, styrene-acrylonitrile-butadiene copolymer, etc.; polyvinyl alcohol; polyamideimides; polyimides; polyetherimides; polycarbonates; polysulfones; polyethersulfones; polyetheretherketones; polyarylates; polyphenylene sulfide; polyphenylene oxide; polyparaxylene; polyacrylonitrile; fluororesins such as polytetrafluoroethylene, polytrifluorochloroethylene, ethylene fluoride-propylene copolymer, etc.; cellulosic polymers such as cellophane; rubber hydrochloride; and copolymers containing constituent units of the various polymers mentioned above. These polymers can be used singly or in combination.

The base film layer may contain a variety of additives, for example stabilizers such as antioxidants, ultraviolet absorbers, heat stabilizers, etc.; antistatic agents such as cationic, anionic, nonionic or amphoteric antistatic agents; nucleating agents; hydrocarbon polymers such as styrenic resins, terpene resins, petroleum resins, dicyclopentadiene resin, chmarone resins such as chmarone-indene resin, phenolic resins, rosins ins and their derivatives, and the corresponding hydrogenated resins; plasticizers; fillers; various waxes such as higher fatty acid amides, higher fatty acids or their salts, higher fatty acid esters, natural waxes of mineral or vegetable origin, synthetic waxes such as polyethylene; particulate lubricants inclusive of finely divided mineral lubricants such as silica series powders, alumina series powders, etc. and finely divided organic lubricants such as polyethylene series powders, acrylic powders, etc.; and coloring agents.

The light transmittance value of the base film layer can be selected as desired but for insuring a sufficient visual access to contents and an aesthetic acceptability of the packaged product, the total light transmittance with respect to white light is generally not less than 40%, preferably not less than 60%, and more preferably not less than 80%.

The base film layer is preferably formed from an olefinic polymer (particularly polypropylene-series polymers), polyester (particularly, polyalkylene terephthalate such as polyethylene terephthalate), polyamide, styrenic polymer, ethylene-vinyl alcohol copolymer, polycarbonate, polyacrylonitrile or the like. The olefinic polymers, polyesters and polyamides are particularly desirable in terms of clarity, mechanical strength and packaging quality.

The preferred material for the packaging of food for retort treatment or microwave heating includes polymers having high transparency, mechanical strength and packaging quality and having excellent heat resistance, such as polypropylene, polyesters, polyamides, ethylene-vinyl alcohol copolymer, polycarbonates and polyacrylonitrile. Particularly preferred polymer for the base film layer includes polypropylene, polyesters and polyamides.

The base film layer may be a single-layer film or a laminate film comprising one or more polymer layers. The thickness of the base film is not critical and can be selected appropriately in consideration of the desired packaging quality, mechanical strength, flexibility and so on. The thickness of the base film layer may be generally about 3 to 200 µm, preferably about 5 to 100 µm, and more preferably about 10 to 50 µm (e.g. about 10 to 30 µm). For boiling or retort application, a base film with a thickness of not greater than 100 µm may practically used.

The base film layer can be formed by the conventional film forming technology which includes, for example, melt-forming method such as the inflation method and the T-die method, and the casting method using a solution. The base film layer may be an unoriented film or an oriented film such as a monoaxially oriented film or a biaxially oriented film. The method for orientation includes such known drawing or stretching methods as roll drawing or stretching, calender drawing or stretching, belt drawing or stretching, tentering, tube drawing or stretching, or a combination of such techniques. The draw or stretching ratio can be judiciously selected according to the required film characteristics. For example, it may be about 1.5 to 20 and preferably about 2 to 15 in at least one direction.

At least one side of the base film layer may have been surface-treated. The surface treatment includes corona discharge treatment, plasma treatment, glow discharge treatment, reverse sputter treatment, flame treatment, chromic acid treatment, solvent treatment, surface roughening and so on. Of the base film layer, the surface-treated side may be used for the formation of the anchor coat layer for improved adhesion.

[Anchor coat layer (primer coating layer)]

The main feature of the present invention resides in improving adhesion properties between the base film layer and the inorganic layer and barrier properties by forming, with an interposition of the specific anchor coat layer, an inorganic layer (in particular a transparent inorganic layer) on at least one surface of the base film layer. The anchor coat layer comprises (A) a chlorine-containing resin, (B) a polyisocyanate compound and (C) a saturated polyester resin having a specific glass transition temperature and being substantially unreactive with respect to the polyisocyanate compound. When a polyester polyol having a reactivity to the polyisocyanate compound (B) is used as the saturated polyester (C), the adhesive properties and barrier properties after retort treatment are remarkably sacrificed. It is probably because of a crosslinking reaction. Therefore, the saturated polyester (C) being soft and substantially unreactive is used in the invention. Further, even when the polyisocyanate compound (B) and the soft and unreactive saturated polyester resin (C) are employed in combination, blocking properties of the anchor coat layer can be improved due to the chlorine-containing resin (A). It should be understood that the term "substantially unreactive" as used in this specification means that a crosslinked cured product would not be formed.

[(A) Chlorine-containing resin]

The chlorine-containing resin includes a homo- or co-polymer (a copolymer formed with a chlorine-containing monomer and a copolymerizable monomer) of a chlorine-containing monomer, a graft copolymer as produced by graft polymerizing a chlorine-containing monomer, a chlorinated polyethylene, a chlorinated polypropylene and other chlorinated polyolefins, typically speaking.

As the chlorine-containing monomer, there may be mentioned vinyl chloride and vinylidene chloride, for example, and these chlorine-containing monomers can be used singly or in combination. Preferred chlorine-containing monomer is vinyl chloride. The copolymerizable monomer includes, for instance, olefins (e.g. ethylene, propylene), vinyl esters (vinyl acetate, vinyl propionate), vinyl cyanides (e.g. acrylonitrile), (meth)acrylates (e.g. a $C_{1-12}$ alkyl acrylate) and others. These copolymerizable monomers may be employed independently or in combination. Further, polymerizable carboxylic acids or derivatives thereof (e.g. acrylic acid, methacrylic acid, itaconic acid, maleic anhydride, maleic acid, a monoalkyl maleate, a dialkyl maleate, fumaric acid or its derivatives corresponding to the maleic acid derivatives) may be employed as the copolymerizable monomer if only in a small amount.

The graft copolymer includes, for instance, a graft copolymer as produced by graft polymerizing vinyl chloride (VC) to an ethylene-vinyl acetate copolymer (EVA), a graft copolymer as produced by graft polymerizing vinyl chloride to a polyurethane and so forth.

Preferred chlorine-containing resin includes a poly(vinyl chloride), a vinyl chloride-based copolymer [e.g. a vinyl chloride-based copolymer comprising at least vinyl chloride and a copolymerizable monomer (in particular, vinyl acetate, etc.) as monomer components. The preferable chlorine-containing resin also includes a copolymer comprising three components or more which comprises a polymerizable carboxylic acid or its derivative (e.g. maleic anhydride) or other third component in addition to the two components of vinyl chloride and the copolymerizable monomer.

The proportion of the vinyl chloride relative to the copolymerizable monomer (e.g. vinyl acetate) may practically be selected from a range according to the species of the copolymerizable monomer, and is, for example, such that vinyl chloride/copolymerizable monomer equals about 95/5 to 50/50 (by weight), and preferably about 95/5 to 65/35 (by weight).

The chlorine-containing resin (A) is substantially unreactive with respect to the polyisocyanate compound. That is, the chlorine-containing resin (A) is unreactive to the polyisocyanate compound (B) or even when the resin (A) has a reactively active hydrogen atom, the concentration of such active hydrogen atom is low. The acid value of the chlorine-containing resin is, for example, about 0 to 30 mg KOH/g, and preferably about 0 to 20 mg KOH/g. This acid value is derived from the polymerizable carboxylic acid or its derivative.

The glass transition temperature of the chlorine-containing resin is about 25° to 80° C. (e.g. about 25° to 60° C.), preferably about 30° to 60° C. and practically about 30° to 50° C., typically speaking.

The molecular weight and polymerization degree of the chlorine-containing resin may be selected from a range not adversely affecting the adhesion properties, and the number average molecular weight is about $0.5 \times 10^4$ to $10 \times 10^4$, preferably about $1 \times 10^4$ to $5 \times 10^4$, and more preferably about $1 \times 10^4$ to $3 \times 10^4$, and the average polymerization degree is about 100 to 1,000, preferably about 150 to 800, and more preferably about 200 to 700 (e.g. about 300 to 700).

[(B) Polyisocyanate compound]

As the polyisocyanate compound, a compound having at least 2 isocyanate groups per molecule. Examples of the polyisocyanate compound include 2,4-tolylene diisocyanate, 2,6-tolylene diisocyanate, phenylene diisocyanate, xylylene diisocyanate, tetramethylxylene diisocyanate, diphenylmethane diisocyanate, tolidine diisocyanate [bis(4-isocyanate-3-methylphenyl)methane], triphenylmethane triisocyanate, 1,5-naphthalene diisocyanate and other aromatic diisocyanates; 1,4-tetramethylene diisocyanate, 1,6-hexamethylene diisocyanate, trimethylhexamethylene diisocyanate, 1,10-decamethylene diisocyanate, lysine diisocyanate, 1,3,6-hexamethylene triisocyanate and other aliphatic diisocyanates; isophorone diisocyanate, a hydrogenated xylylene diisocyanate, a hydrogenated diphenylmethane diisocyanate and other alicyclic diisocyanates; modified polyisocyanates and so on. The modified polyisocyanate includes, for instance, an adduct as formed by adding a polyisocyanate to a polyhydric alcohol, a dimer, a trimer having an isocyanulate ring, an allophanate-modified polyisocyanate, a urea-modified polyisocyanate, a buret-modified polyisocyanate and the like. The polyhydric alcohol in the adduct includes a low molecular weight polyol having 3 or more hydroxyl groups, such as glycerin, trimethylolpropane, trimethylolethane and other triols, pentaerythritol and other tetraols, generally speaking. These polyisocyanates may be used singly or in combination.

Preferred polyisocyanate compound includes a low molecular weight compound having 3 or more isocyanate groups per molecule, such as an adduct as formed by adding 3 mole of a polyisocyanate compound (e.g. a diisocyanate) to 1 mole of trimethylolpropane. The molecular weight of the polyisocyanate compound may be selected within the range of, for instance, about 150 to 1,000 and preferably about 300 to 1,000.

[(C) Saturated polyester resin]

As the saturated polyester, a variety of polyesters obtainable by condensing a polycarboxylic acid or its acid anhydride or lower alcohol ester thereof with a polyhydric alcohol can be employed. Moreover, a hydroxycarboxylic acid may also be used in the condensation reaction.

The polycarboxylic acid component includes, for example, phthalic acid, isophthalic acid, terephthalic acid, trimellitic acid, pyromellitic acid and other aromatic carboxylic acids and the corresponding anhydrides; succinic acid, glutaric acid, adipic acid, azelaic acid, sebacic acid and other aliphatic carboxylic acids and the corresponding anhydrides. As the polycarboxylic acid component, phthalic acid, isophthalic acid, terephthalic acid and other aromatic dicarboxylic acids and the corresponding anhydrides, adipic acid, azelaic acid, sebacic acid and other saturated aliphatic dicarboxylic acid may practically be employed. Examples of the hydroxycarboxylic acid includes β-hydroxypropionic acid and β-hydroxybutyric acid.

The polyhydric alcohol component includes, for example, ethylene glycol, propylene glycol, trimethylene glycol, 1,3-butanediol, 1,4-butanediol, 1,5-pentanediol, 1,6-hexanediol, neopentyl glycol and other aliphatic dihydric alcohols; diethylene glycol, triethylene glycol, tetraethylene glycol, dipropylene glycol, tripropylene glycol, tetrapropylene glycol, polytetramethylene ether glycol and other polyoxyalkylene glycols; glycerin, trimethylolpropane, trimethylolethane, pentaerythritol and other aliphatic polyhydric alcohols; cyclohexanediol, a hydrogenated bisphenol A and other alicyclic polyhydric alcohols; bisphenol A-alkylene oxide adducts, such as 2,2-bis(4-dihydroxyethylphenyl)propane and 2,2-bis(4-dihydroxypropylphenyl)propane, and other aromatic polyhydric alcohols.

For the purpose of sealing remained hydroxyl group or carboxyl group, a monohydric alcohol or a monocarboxylic acid may be employed as a terminal sealing agent.

Preferably polyester is generally other polyester than poly(alkylene terephthalate), and is (C1) a noncrystalline polyester being soluble in an organic solvent (e.g. a non-crystalline linear polyester). Such polyester resin includes, for instance, aromatic ring-containing polyesters, in which the aromatic ring is derived from an aromatic polycarboxylic acid such as terephthalic acid, phthalic acid, isophthalic acid (e.g. oil-free aromatic polyesters), (C2) a thermoplastic elastomer comprising a poly(alkylene glycol) unit (e.g. polytetramethylene ether glycol unit) as a soft segment, and a poly(alkylene terephthalate) unit [e.g. poly(ethylene terephthalate) unit, poly(butylene terephthalate) unit] as a hard segment. The saturated polyester resin (C1) includes modified polyesters (modified polyalkylene terephthalate) prepared by partial replacement of the alkylene glycol and/or terephthalic acid unit of poly(alkylene terephthalate) with a different diol (e.g. diethylene glycol, triethylene glycol and other soft diol components) and/or dicarboxylic acid (e.g. phthalic acid, isophthalic acid, adipic acid), and isophthalic acid-based polyesters comprising isophthalic acid and a glycol (e.g. ethylene glycol) as main components.

The saturated polyester can clearly be distinguished from polyols (e.g. polyester polyols, polyether polyol, acrylic polyols) for forming a two-component curable adhesive in combination with a polyisocyanate compound. That is, the polyol constituting the two-component curable adhesive usually have an OH value of not less than 40 mg KOH/g for the purpose of crosslinking with the polyisocyanate compound, but the saturated polyester resin is substantially unreactive to the polyisocyanate compound in the same manner as the chlorine-containing resin. The OH value of the saturated polyester resin is about 0 to 15 mg KOH/g, preferably about 0 to 10 mg KOH/g, an practically about 0 to 5 mg KOH/g, for instance. The acid value of the saturated polyester resin may for example about 0 to 10 mg KOH/g, preferably about 0 to 7 mg KOH/g and practically about 0 to 5 mg KOH/g.

According to the present invention, a soft and unreactive saturated polyester is used in the combination of the chlorine-containing resin, polyisocyanate compound and saturated polyester resin, in order to retain the adhesive properties between the base film layer and the inorganic layer, and barrier properties at high level irrespective of being exposed to severe conditions such as retort treatment. The glass transition temperature of the saturated polyester is about −10° C. to 20° C., preferably about −5° C. to 15° C. (e.g. about 0° to 15° C.), typically speaking. The transition temperature may practically be about 0° to 20° C.

The molecular weight of the saturated polyester resin can be selected from a range not sacrificing the adhesive properties and barrier properties, and the number average molecular weight is about $0.5 \times 10^4$ to $10 \times 10^4$, preferably about $1 \times 10^4$ to $5 \times 10^4$ and more preferably about $1 \times 10^4$ to $3 \times 10^4$.

[Proportions of components in the anchor coat layer]

The proportions of the components of the anchor coat layer can be selected within a range not interfering with the adhesive properties and barrier properties, and for example the anchor coat layer comprises, relative to 100 parts by weight of the chlorine-containing resin (A), about 10 to 500 parts by weight (preferably about 25 to 400 parts by weight, and more preferably about 30 to 300 parts by weight) of the polyisocyanate compound (B), and about 1 to 50 parts by weight (preferably about 2 to 50 parts by weight, and more preferably about 5 to 30 parts by weight) of the saturated polyester resin (C). Incidentally, even when an anchor coat layer comprising, relative to 100 parts by weight of the chlorine-containing resin (A), about 30 to 200 parts by weight (e.g. about 30 to 150 parts by weight) of the polyisocyanate compound (B) and about 3 to 20 parts by weight (e.g. about 5 to 20 parts by weight) of the saturated polyester (C) is formed, high adhesive properties and excellent barrier properties can be insured.

The proportion of the saturated polyester (C) is generally less than that of the polyisocyanate compound (B), and is, for example, about 5 to 50 parts by weight, preferably about 7 to 40 parts by weight, and more preferably about 10 to 30 parts by weight relative to 100 parts by weight of the polyisocyanate compound (B).

The anchor coat layer may comprise a variety of additives such as antioxidants, ultraviolet ray absorbents, heat stabilizers and other stabilizers; plasticizers; fillers; coloring agents and so forth.

The thickness of the anchor coat layer (undercoat layer) can be selected within a range as far as improving the adhesive properties with respect to the inorganic layer and not sacrificing the barrier properties, and is about 0.01 to 5 82 m (e.g. about 0.1 to 5 $\mu$m), and preferably about 0.1 to 1 $\mu$m (e.g. about 0.2 to 1 $\mu$m). Even when the anchor coat layer has a thickness of about 0.2 to 0.7 $\mu$m, the layer exhibits high adhesive properties with respect to the inorganic layer without deteriorating the barrier properties.

[Inorganic layer]

The inorganic substance forming the inorganic layer can preferably be any inorganic substance capable of forming a thin, transparent layer. Thus, the inorganic substance that can be used includes, for example, Group 2A elements of Periodic table such as beryllium, magnesium, calcium, strontium, barium, etc.; transition metal elements such as titanium, zirconium, tantalum, ruthenium, etc.; Group 2B elements such as zinc etc.; Group 3B elements such as aluminum, gallium, indium, thallium, etc.; Group 4B elements such as silicon, germanium, tin, etc.; and Group 6B elements such as selenium, tellurium, etc.; and inorganic compounds containing these elements, such as the oxides, halides, carbides and nitrides. These inorganic substances can be employed singly or in combination.

The preferred inorganic substance includes, among others, Group 2A elements such as magnesium, calcium, barium, etc.; transition metal elements such as titanium, zirconium, tantalum, ruthenium, etc.; Group 2B elements such as zinc; Group 3B elements such as aluminum, indium, thallium, etc.; Group 4B elements such as silicon, tin, etc.; Group 6B elements such as selenium; and the oxides of these elements. The inorganic layer is most preferably formed from one of Group 3B or Group 4B elements or its oxide.

Among the inorganic substances mentioned above, the oxides of the elements (e.g. tin oxide, aluminium oxide, indium oxide, the corresponding composite oxide, silicon oxide, etc.) are very satisfactory in transparency and barrier properties. Silicon oxide, in particular, is advantageous in that, in addition to the above characteristics, this oxide shows sustained high barrier properties for a long time even under high temperature conditions. It should be understood that the silicon oxide mentioned above includes not only silicon monoxide and silicon dioxide but also those silicon-containing oxides which may be represented by the composition formula $SiO_x$ (wherein $0 < x \leq 2$, preferably $0.8 \leq x \leq 1.5$).

Of these inorganic substances, the so-called electrically nonconductive inorganic substances having low electrical conductivity, such as the oxides, halides, carbides and nitrides, can be used for the packaging materials intended for use in microwave heating applications. The preferred electrically nonconductive inorganic substance includes, for example, oxides such as silicon oxide.

The thickness of the inorganic layer can be selected within the range of generally about 100 to 5,000 Å (0.01 to 0.5 $\mu$m), preferably about 200 to 3,000 Å (0.02 to 0.3 $\mu$m) and more preferably about 300 to 1,500 Å (0.03 to 0.15 $\mu$m). If the thickness is less than 100 Å, a homogeneous thin layer can hardly be formed so that no sufficient barrier effect or mechanical strength can be expected. On the other hand, no appreciable improvement in barrier performance can be obtained and loss of clarity or deterioration of the external appearance occurs by increasing the thickness of the layer beyond 5,000 Å and such practice rather results in an economic disadvantage.

The barrier composite film of the invention is characterized in that the anchor coat layer is soft. Namely, the barrier composite film of the invention includes, in addition to the above-mentioned composite film, a barrier composite film comprising a base film layer, a soft anchor coat layer (an anchor coat layer having an elastic modulus of 0.1 to $10 \times 10^1$ to $1 \times 10^3$ N/mm$^2$) formed on at least one surface of the base film layer and an inorganic oxide thin layer formed on the anchor coat layer. Preferable anchor coat layer has an elastic modulus of about $0.5 \times 10^1$ to $7 \times 10^2$ N/mm$^2$, in particular about $1 \times 10^1$ to $5 \times 10^2$ N/mm$^2$.

Further, the barrier composite film of the invention is characterized in that it exhibits excellent adhesive properties and satisfactorily high barrier properties even under severe conditions such as retort treatment. The composite film of the invention also includes a barrier composite film comprising a base film layer, an anchor coat layer formed on at least one side of the base film layer, and an inorganic oxide thin layer formed on the anchor coat layer, wherein the peel strength of the anchor coat layer with respect to the base film layer, after subjected to retort treatment at 120° C. for 30 minutes, is not less than 100 g/15 mm (e.g. about 100 to 500 g/15 mm). The peel strength of the anchor coat layer with respect to the base film layer is preferably about 150 to 500 g/15 mm, and more preferably about 200 to 400 g/15 mm.

These composite films are excellent in barrier properties, and exhibit, after retort treatment at 120° C. for 30 minutes, an oxygen gas permeability of not greater than 5 cc/m$^2$.24 hr. (e.g. about 0.01 to 3 cc/m$^2$.24 hr.), preferably not greater than 3 cc/m$^2$.24 hr. (e.g. 0.01 to 2 cc/m$^2$.24 hr.), and more preferably not greater than 2 cc/m$^2$.24 hr. (e.g. about 0.01 to 1 cc/m$^2$.24 hr.), and a water vapor permeability of not greater than 10 g/m$^2$.24 hr. (e.g. about 0.01 to 10 g/m$^2$.24 hr.), preferably about 0.1 to 5 g/m$^2$.24 hr. and more preferably about 0.1 to 3 g/m$^2$.24 hr. as determined in a film having the base film layer in 10 to 30 $\mu$m thickness and the covering layer comprising the anchor coat layer and inorganic layer in 0.1 to 0.5 $\mu$m.

[Polymer layer]

In the present invention, at least one polymer layer may be formed on the inorganic thin layer of the composite film. This polymer layer may be selected according to the use of the composite film as for protection of the inorganic layer, improvement of the barrier properties, impartment of printing properties (coloring properties) and/or adhesive properties, and may have transparency. Preferable polymer layer includes a barrier resin layer and heat seal layer, typically speaking.

The term "barrier resin layer" as used throughout this specification means a layer comprising a barrier resin with an oxygen gas permeability not greater than 20 cc/m$^2$.24 hr. at 25° C. and a water vapor permeability of not greater than 20 g/m$^2$.24 hr. at 40° C. and 90% R.H. at a layer thickness of 2 μm. The term "heat-sealing layer" means a thermally sealable layer not only by means of a heat sealer but also by impulse sealing, high frequency bonding, ultrasonic sealing and other bonding techniques.

As the barrier resin, there may be mentioned for instance vinylidene chloride-based copolymers, ethylene-vinyl alcohol copolymers, polyamide-series polymers, polyvinyl alcohol-series polymers, polyacrylonitrile-series polymers, urethane-series polymers and the like. Incidentally, there are some polymers which do not exhibit the above specified barrier characteristics depending on the composition of the barrier resin. By way of an example, there may be mentioned a thermoplastic polyurethane having a comparatively long segment (e.g. a polyalkyleneoxy segment). These barrier resins may be employed independently or in combination.

The preferred barrier resin includes vinylidene chloride-based copolymers and ethylene-vinyl alcohol copolymers. The vinylidene chloride-based copolymers are copolymers of vinylidene chloride with other copolymerizable monomers. Among such copolymerizable monomers are vinyl chloride, vinyl acetate, crotonic acid, acrylic acid and acrylates (e.g. a $C_{1-8}$ alkylacrylate), such as methyl acrylate, ethyl acrylate, propyl acrylate, isopropyl acrylate, butyl acrylate, isobutyl acrylate, tert-butyl acrylate, pentyl acrylate, hexyl acrylate, etc., acrylonitrile, methacrylonitrile, and methacrylic acid and methacrylates corresponding to the acrylic esters mentioned above. Among these vinylidene chloride-based copolymers, the preferred copolymers are vinylidene chloride-acrylonitrile copolymer, vinylidene chloride-methacrylic acid copolymer, vinylidene chloride-acrylate copolymer, vinylidene chloride-methacrylate copolymer, vinylidene chloride-vinyl acetate copolymer and so on. The vinylidene chloride contents of such vinylidene chloride-based copolymers are generally about 85 to 99 weight % and preferably about 90 to 97 weight %.

The ethylene-vinyl alcohol copolymer is preferably a solvent-soluble or soluble-dispersible ethylene-vinyl alcohol copolymer. The ethylene content of such ethylene-vinyl alcohol copolymer is generally about 5 to 50 mol %, preferably about 10 to 45 mol %, and more preferably about 25 to 35 mol % and its molecular weight (weight average molecular weight) may for example be about $1 \times 10^4$ to $10 \times 10^4$, preferably about $2 \times 10^4$ to $7 \times 10^4$, and more preferably about $4 \times 10^4$ to $5 \times 10^4$. The degree of saponification is preferably not less than 99.5%. Such a solvent-soluble ethylene-vinyl alcohol copolymer is soluble or dispersible in water or a mixed solvent of water and alcohol and, on coating, gives a thin film.

Depending on the desired barrier performance (barrier properties with respect to, for example, oxygen, water vapor, carbon dioxide, organic solvent gas and an aroma component such as limonene), the barrier resin layer may comprise at least one species or plural species of the barrier resin (preferably vinylidene chloride-based copolymers and ethylene-vinyl alcohol copolymers). Moreover, the barrier resin layer may be formed with a plurality of layers each comprising a barrier resin. For example, the barrier resin layer may be a multi-layer structure including a vinylidene chloride-based copolymer layer and an ethylene-vinyl alcohol copolymer layer. The barrier resin content of the barrier resin layer is not less than 50 weight %, preferably about 75 to 100 weight % and more preferably about 90 to 100 weight %.

Furthermore, the barrier resin layer may contain other polymers, for example olefinic polymers such as ethylene-vinyl acetate copolymer, ethylene-ethyl acrylate copolymer, etc.; acrylic polymers; styrenic polymers; polyesters; polyacetals; polyvinyl acetate; polyvinyl chloride; vinyl chloride-vinyl acetate copolymer; polyamides; urethane series polymers; acrylonitrile series polymers; polycarbonates; chlorinated polyolefins; cellulosic polymers and so on.

Where necessary, the barrier resin layer may contain additives such as those mentioned above.

The thickness of the barrier resin layer can be selected within the range not adversely affecting the film characteristics and may for example be about 0.05 to 15 μm, preferably about 0.1 to 10 μm (e.g. 0.2 to 7 μm), and more preferably about 0.25 to 5 μm (e.g. 0.3 to 3 μm). If the thickness of the barrier resin layer is less than 0.05 μm, sufficiently high barrier properties may hardly be obtained. On the other hand, increasing the thickness beyond 15 μm would not be rewarded with a commensurate improvement in barrier performance but would be rather uneconomical.

The thickness ratio of the barrier resin layer to the inorganic layer can be selected as desired but this ratio has bearings on barrier properties. In order to provide for high barrier properties and aging resistance, the ratio of the thickness T (μm) of the barrier resin layer to the thickness t (μm) of the inorganic layer, i.e. T/t, may for example be about 0.1 to 1,500, preferably about 0.5 to 500 (e.g. about 1 to 200), and more preferably about 1 to 100. In many instances, the preferred ratio is about 2 to 50 (e.g. about 5 to 50). If the thickness ratio deviates from the above range, it will be difficult to provide for high barrier properties. Thus, if the above ratio is less than 0.1, the inorganic layer tends to be cause defects by external forces. On the other hand, increasing the ratio beyond 1,500 would not be rewarded with a commensurate improvement in barrier performance and be uneconomical.

To facilitate the production of a bag, a pouch or other container, the inorganic layer or barrier resin layer may be covered with a heat-sealing layer. Moreover, the heat-sealing layer may be formed on the other side of the base film layer. In this case, one side of the base film layer need only be covered at least with the inorganic layer and barrier resin layer.

The polymer that can be used for forming the heat-sealing layer includes heat-bondable polymers, for example olefinic polymers, vinyl acetate-vinyl chloride copolymer, polyesters, polyamides and rubber series polymers. These heat-bondable polymers can be used singly or in combination.

The heat-bondable olefinic polymer includes, for example, a polyethylene (e.g. a low density polyethylene and linear low density polyethylene), an ethylene-based copolymer (e.g. an ethylene-butene-1 copolymer, an ethylene-(4-methylpentene-1) copolymer, an ethylene-hexene-1-copolymer, an ethylene-vinyl acetate copolymer, an ethylene-(meth)acrylic acid copolymer, an ethylene (meth)acrylate copolymer), ionomers, polypropylene, a propylene-based copolymer (e.g. a propylene-butene-1 copolymer, an ethylene-propylene copolymer, an ethylene-propylene-butene-1 copolymer, an ethylene- propylene-diene copolymer), and modified polyolefins such as a maleic anhydride-modified polyethylene and a maleic anhydride-modified polypropylene. The preferred olefinic polymer includes a polyethylene, an ethylene-vinyl acetate copolymer, an ethylene-ethyl acrylate copolymer, amorphous polyolefins (e.g. amorphous polypropylene), an ethylene-propylene copolymer and so on. When the heat-sealing layer is formed by the lamination technique, the preferred heat-bondable film includes an unoriented polypropylene film and unoriented ethylene-propylene copolymer film.

The heat-bondable polyester includes aliphatic polyesters comprising both an aliphatic diol and an aliphatic dicarboxylic acid. The heat-bondable polyamide includes, for example, nylon 11, nylon 12 and nylon 6/12. The rubber series polymer includes, for example, butyl rubber, isobutylene rubber, chloroprene rubber, styrene-acrylonitrile copolymer, styrene-butadiene copolymer, styrene-acrylonitrile-butadiene terpolymer and so on.

The thickness of the heat-sealing layer can be liberally selected, for example from the range of about 3 to 100 μm, according to the intended uses for the packaging material. When the heat-sealing layer is provided by the film laminating method, the thickness may for example be about 20 to 100 μm and is preferably about 30 to 80 μm.

The heat-sealing layer can be formed in a selected location (e.g. heat-sealing portion) of the surface of the inorganic layer or barrier resin layer and may be either of part-coated or whole coated, but is generally formed all over the surface of the inorganic layer or barrier resin layer. Moreover, as mentioned hereinbefore, the heat-sealing layer may be formed in a selected heat-sealing part or the entirety of the other side of the base film layer.

The heat-sealing layer may comprise the above mentioned additives where necessary.

As the polymer layer, a resin layer such as a vinyl chloride-based resin [poly(vinyl chloride) or its copolymer], a poly(alkylene terephthalate) [e.g. poly(ethylene terephthalate)] or other polyester resins may be formed.

[Production method of barrier composite film]

One kind of the barrier composite film according to the present invention can be obtained by covering at least one side of the base film with the anchor coat layer and the inorganic layer in that order.

Another kind of the barrier composite film according to the invention can be obtained by forming a barrier resin layer or heat-sealing layer on the inorganic thin layer or the other side of the base film layer. In more detail, the composite film can be produced by (i) a process which comprises covering at least one side of the base film with the anchor coat layer, inorganic thin layer, and barrier resin layer or heat-sealing layer in that order, (ii) a process which comprises covering at least one side of the base film with the anchor coat layer, inorganic thin layer, barrier resin layer and heat-sealing layer in turn, or (iii) a process which comprises covering one side of the base film successively with the anchor coat layer, inorganic thin layer, and if necessary barrier resin layer and/or heat-sealing layer and covering the other side of the base film with the barrier resin layer and/or heat-sealing layer.

There is no particular limitation on the method of forming the anchor coat layer. The anchor coat layer can be formed by applying a coating composition containing the above-mentioned anchor coat layer components (A) to (C) by the conventional technique such as roll coating, gravure coating, reverse coating, spray coating, etc. and drying or curing the coating layer. The coating composition may be a solution or a dispersion. As the solvent, there may be mentioned for instance hexane, cyclohexane, benzene, toluene and other hydrocarbons, ethyl acetate, butyl acetate and other esters, acetone, methyl ethyl ketone and other ketones, tetrahydrofuran and other ethers, and mixed solvents of these solvents.

The anchor coat layer is non-adhesive and has high antiblocking properties as being different from the two-component curable adhesive comprising a polyisocyanate compound and a polyol. Therefore, even if the anchor coat layer is formed by coating, winding and rewinding of the film can be carried out smoothly and hence the productivity of the composite film can be improved.

The inorganic layer can be formed by covering the surface of the anchor coat layer with the inorganic substance utilizing the conventional technology which includes physical methods (e.g. vacuum vapor deposition, reactive vapor deposition, sputtering, reactive sputtering, ion plating, reactive ion plating, etc.) and chemical methods (e.g. CVD, plasma CVD and laser CVD processes). The inorganic layer may be practically formed by physical methods such as vapor deposition. The formation of the thin layer according to vacuum vapor deposition, for example, can be effected in such a manner by passing the base film having the anchor coat layer through a rolled-up vacuum deposition apparatus under a reduced pressure of $10^{-3}$ to $10^{-6}$ Torr with delivering or supplying the film as rolled up, and heating and vaporizing the inorganic compound by means of electron beam, high frequency induction heating, resistance heating or other technologies for continuous deposition.

The polymer layer may be formed by a conventional technology such as coating or laminating. The barrier resin layer can be formed by applying a coating composition containing the barrier resin to the surface of the inorganic layer. The coating composition may be prepared with selecting a suitable solvent which can be selected according to the type of the barrier resin, and it may be a solution or a dispersion.

The solvent for such a coating solution containing a vinylidene chloride-based copolymer can be selected according to the species of vinylidene chloride series copolymer and typically includes, for example, ketones such as acetone, methyl ethyl ketone, cyclohexanone, etc.; ethers such as dioxane, diethyl ether, tetrahydrofuran, etc.; aromatic hydrocarbons such as benzene, toluene, xylene, etc.; esters such as ethyl acetate, butyl acetate, etc.; amides such as dimethylformamide etc.; and mixtures of such solvents. The dispersions are generally available in the form of O/W emulsion from commercial sources.

The coating composition containing an ethylenevinyl alcohol copolymer can be generally prepared by using a mixed solvent composed of water and alcohol. The alcohol that can be used typically includes methanol, ethanol, propanol, isopropyl alcohol, cyclohexanol and so on.

The coating composition described above may contain a variety of additives such as those mentioned hereinbefore. For improved coatability, the composition may contain the conventional additives such as an antifoam and a rheology modifier.

The method for coating is not critical, and the conventional techniques such as air-knife coating, roll coating, gravure coating, blade coating, dip coating, spray coating and other coating methods can be selectively employed. Following application of the coating composition, the coating is dried at a temperature of about 50° to 150° C., whereby the desired barrier resin layer is obtained.

Where necessary, the surface of the barrier resin layer may be subjected to a conventional surface treatment as illustrated in the explanation of the base film regardless of the presence of the heat-sealing layer or not, or an adhesive layer or protective layer may be formed partially or throughout the whole of the coating layer without such surface treatment.

The heat-sealing layer can be formed by the conventional method according to the type of heat-bondable polymer, such as dry lamination, extrusion lamination or coating.

The barrier composite film of the present invention may be provided, according to the type and intended use of film, with an optional coating layer and/or a laminating layer, such as a lubricating layer, an antistatic layer, an ornamental printed film layer or a reinforcing layer such as a nylon film.

The barrier composite film of the invention wherein a specific anchor coat layer is interposed between a base film layer and an inorganic layer insures remarkable improvement of adhesive force between the inorganic layer and the base film, and significantly enhanced barrier properties. Further, the film exhibits excellent barrier properties over a long period with maintaining high adhesive properties between the inorganic layer and base film layer, not only in normal conditions (ordinary conditions) but even when exposed to severe conditions such as retort treatment or microwave heating. Moreover, the film has excellent barrier properties and high clarity. Therefore, the film has high transparency and visual accessibility to contained items so that it is useful for long-term preservation of contained items such as foods, pharmaceutical products and precisiion electronic devices. Further, when applied to packaging applications of foods, it provides a long-term preservation of contained items with inhibiting deterioration or decomposition, by means of the high adhesive properties and excellent barrier properties. As described above, this invention discloses a use of the barrier composite film for packaging of various contents such as the foods, pharmaceutical products, electric devices and so on.

Furthermore, the resin component constituting the anchor coat layer is substantially unreactive to the polyisocyanate compound, and the anchor coat layer is non-adhesive and does not exhibit blocking properties. Accordingly, the anchor coat composition can effectively be utilized with repetition, and winding and rewinding of the film can easily be effected to insure improved productivity of the composite film.

INDUSTRIAL APPLICABILITY OF THE INVENTION

The barrier composite film of the present invention can advantageously be used for the packaging of various product items such as food for microwave oven cooking, retort foods, frozen foods, products to be microwave-sterilized, flavor barrier-packaged items, pharmaceutical products, precision electronic components, etc. and for the production of balloons such as a baloon and a fly baloon.

There is no particular restriction to the form of package that can be provided using the film of the present invention. Thus, for example, bags or pouches for formed items (solid foods) and those for liquid items may be mentioned. Bags or pouches containing such food items can be directly submitted to retort treatment or microwave heating.

The package form which the packaging material of the present invention can provide includes containers such as various types of bags or pouches, cups, tubes, standing bags, trays, etc., covers, interliners for paper packs for sake, soy, mirin, oil, milk, fruit juice and so on.

EXAMPLES

The following examples are intended to illustrate the present invention in more detail but should by no means be construed as defining the scope of the invention.

Examples 1 to 8 and Comparative Example 1

On one side of a 12 μm-thick biaxially oriented poly (ethylene terephthalate) film was applied an anchor coat composition shown in Table 1 in a dry thickness of 0.3 μm and the coated film was dried. By the vacuum vapor deposition technique using SiO as the vapor source, a 500 Å-thick silicon oxide vapor deposited layer was deposited, as an inorganic layer, on the coated side of the base film in a vacuum of $5 \times 10^{-3}$ Torr to give a composite film. For the anchor coat composition, the following components were employed. The proportions of the components of the anchor coat composition were respectively indicated as a dry matter basis.

(A1) Vinyl chloride-based copolymer: Denki Kagakukogyo Co., Ltd., Denka 1000C, a vinyl chloride-vinyl acetatemaleic anhydride copolymer, chlorine content 48.8%, average polymerization degree 430, glass transition temperature 43° C., acid value derived from maleic anhydride about 10 mg KOH/g (B1) Polyisocyanate compound: Nippon Polyurethane Industries, Ltd., Colonate L, an adduct of tolylene-diisocyanate-trimethylolpropane, nonvolatile 75% by weight, isocyanate content 12%

(C) Saturated polyester: Toyobo Co., Ltd., Vylon 30SS, a polyester resin comprising terephthalic acid and ethylene glycol as main components, number average molecular weight 22,000, glass transition temperature 7° C., hydroxy value 4.8 mg KOH/g Examples 9 and 10

A composite film was provided in the same manner as Examples 6 and 7 except for using the following vinyl chloride-based copolymer in lieu of the vinyl chloride-based copolymer used in Examples 1 to 8.

(A2) Vinyl chloride-based copolymer: Denki KagakuKogyo Co., Ltd., Denka 1000CM, a vinyl chloride-vinyl acetate-maleic acid copolymer, chlorine content 48.8%, average polymerization degree 430, glass transition temperature 43° C., acid value derived from maleic acid about 10 mg KOH/g Examples 11 and 12

The procedure of Example 6 was repeated except for employing the following polyisocyanate compound in lieu of the polyisocyanate compound used in Examples 1 to 8 to provide a composite film.

(B2) Polyisocyanate compound: Nippon Polyurethane Industries, Ltd., Colonate HL, an adduct of hexa-methylenediisocyanate-trimethylolpropane, nonvolatile 75% by weight, isocyanate content 15%

(B3) Polyisocyanate compound: Hülls AG, Bestanate T1890L, a trimer of isophorone diisocyanate, nonvolatile 70% by weight, isocyanate content 12%

Comparative Examples 2 to 7

A composite film was produced in the similar manner to Example 6 except that the following two-component curable polyurethane adhesive was used instead of the anchor coat composition used in Examples 1 to 8. In Comparative Example 2, the two-component curable polyurethane adhesive was applied in a dry thickness of 0.4 μm.

Comparative Example 2
Two-component curable polyurethane adhesive (AC1)

An anchor coat composition comprising a polyether polyol (Toyo Morton Co., Ltd., Adcoat AD76H5, hydroxyl value 38 mg KOH/g, glass transition temperature 20° C.) and a polyisocyanate component (Toyo Morton Co., Ltd., CAT-10)

Comparative Example 3
Two-component curable polyurethane adhesive (AC2)

An anchor coat composition comprising 100 parts by weight of a polyester polyol (Toyo Morton Co., Ltd., Adcoat AD335AE, hydroxyl value 85 mg KOH/g, glass transition temperature −15° C.) and 5 parts by weight of a polyisocyanate (Toyo Morton Co., Ltd., CAT-10)

Comparative Example 4
Two-component curable polyurethane adhesive (AC3)

An anchor coat composition comprising 100 parts by weight of the polyester polyol used in Comparative Example 3 and 10 parts by weight of the polyisocyanate used in Comparative Example 3

Comparative Example 5
Two-component curable polyurethane adhesive (AC4)

An anchor coat composition comprising 100 parts by weight of the polyester polyol used in Comparative Example 3 and 20 parts by weight of the polyisocyanate used in Comparative Example 3

Comparative Example 6
Two-component curable polyurethane adhesive (AC5)

An anchor coat composition comprising 100 parts by weight of the polyester polyol used in Comparative Example 3 and 30 parts by weight of the polyisocyanate used in Comparative Example 3

Comparative Example 7
Two-component curable polyurethane adhesive (AC6)

An anchor coat composition comprising 100 parts by weight of the polyester polyol used in Comparative Example 3 and 50 parts by weight of the polyisocyanate used in Comparative Example 3

Comparative Example 8

A composite film was obtained in the same manner as Example 1, except that the anchor coating composition was not applied.

By means of dry laminating technique, a heat-sealing layer was formed on the inorganic layer of each composite films obtained in the above examples and comparative examples in the following manner to prepare a test sample. That is, on the inorganic layer was applied a laminating adhesive (Toyo Morton Co., Ltd., Adcoat AD-810/CAT-RT8, two-component curable polyurethane adhesive) in a dry thickness of about 2 μm, and a sealant (Daicel Chemical Industries, Ltd., Cenesea C153#40, an unstretched polypropylene, 40 μm in thickness) was laminated thereon to form a heat-sealing layer.

The adhesive strength, oxygen gas permeability and water vapor permeability of the test samples were evaluated by the following methods for before and after retort treatment at 120° C. for 30 minutes.

Oxygen gas permeability

By the isobaric method (instrument: Morcon's OXYT-RAN TWIN), determinations were made at 20° C. and 65% R.H. The results were expressed in units of cc/m$^2$.24 hr.

Water vapor permeability

Using an instrument (Morcon's PERMATRAN W200), determinations were made at 40° C. and 90% R.H. The results were indicated in units of g/m$^2$.24 hr.

Adhesive strength

The peel strength (separating strength) between the test film and the heat-sealing layer was evaluated by drawing each film at a rate of 300 mm/min. with the use of an instrument (ORIENTEC's RTM-100).

Further, a sample of the anchor coat layer (width 5 mm, length 10 mm, thickness 0.5 mm) was prepared, and the elastic modulus (N/mm$^2$) of the sample was determined at a temperature of 30° C. and at a frequency of 1 Hz with the use of a viscoelastic instrument (IWAMOTO SEI-SAKUSHO Co., Ltd., VES-FIII). The results are set forth in Table 1.

TABLE 1

| | Anchor coating composition | | | Elastic modulus of anchor coat layer | Before retort treatment | | | After retort treatment | | |
|---|---|---|---|---|---|---|---|---|---|---|
| | Component (A) | Component (B) | Component (C) | | Adhesive strength | O$_2$-TR | WV-TR | Adhesive strength | O$_2$-TR | WV-TR |
| Example 1 | 100 | 45 | 9 | $4.8 \times 10^1$ | 405 | 0.1 | 0.8 | 235 | 3.2 | 8.2 |
| Example 2 | 100 | 30 | 9 | $4.2 \times 10^1$ | 375 | 0.5 | 1.2 | 195 | 3.0 | 7.4 |
| Comp. Ex. 1 | 100 | — | 9 | $1.6 \times 10^1$ | 5 | 0.2 | 0.4 | 25 | 3.2 | 8.0 |
| Example 3 | 100 | 60 | 6 | $5.4 \times 10^1$ | 375 | 0.1 | 0.3 | 260 | 0.8 | 1.8 |
| Example 4 | 100 | 60 | 3 | $2.0 \times 10^2$ | 325 | 0.8 | 1.4 | 260 | 4.8 | 7.3 |
| Example 5 | 100 | 75 | 11.3 | $7.3 \times 10^1$ | 370 | 0.2 | 0.4 | 255 | 4.4 | 8.2 |
| Example 6 | 100 | 100 | 15 | $5.2 \times 10^1$ | 315 | 0.1 | 0.3 | 290 | 0.8 | 1.3 |
| Example 7 | 100 | 150 | 22.5 | $4.8 \times 10^1$ | 315 | 0.2 | 0.5 | 230 | 0.5 | 0.7 |
| Example 8 | 100 | 300 | 45 | $2.8 \times 10^2$ | 220 | 2.0 | 4.8 | — | 3.3 | 7.3 |
| Example 9 | 100 | 100 | 15 | $3.8 \times 10^1$ | 400 | 0.1 | 0.3 | 200 | 1.2 | 1.4 |
| Example 10 | 100 | 150 | 22.5 | $4.8 \times 10^1$ | 350 | 0.5 | 0.7 | 180 | 0.8 | 1.2 |
| Example 11 | 100 | 100 | 15 | $3.1 \times 10^1$ | 380 | 0.1 | 0.3 | 420 | 0.3 | 0.8 |
| Example 12 | 100 | 100 | 15 | $5.3 \times 10^1$ | 420 | 0.2 | 0.4 | 520 | 0.3 | 0.9 |
| Comp. Ex. 2 | Two-component curable adhesive (AC1) | | | $2.6 \times 10^1$ | 220 | 9.9 | >20 | — | — | — |
| Comp. Ex. 3 | Two-component curable adhesive (AC2) | | | 4.2 | 20 | 0.5 | 0.6 | 125 | 4.5 | >10 |
| Comp. Ex. 4 | Two-component curable adhesive (AC3) | | | 6.3 | 50 | 0.4 | 0.6 | 300 | 4.3 | >10 |
| Comp. Ex. 5 | Two-component curable adhesive (AC4) | | | $1.3 \times 10^1$ | 60 | 0.3 | 0.5 | 95 | 3.2 | >10 |
| Comp. Ex. 6 | Two-component curable adhesive (AC5) | | | $4.5 \times 10^1$ | 190 | 0.4 | 0.5 | 65 | 3.0 | >10 |

TABLE 1-continued

| | Anchor coating composition | | | Elastic modulus | Before retort treatment | | | After retort treatment | | |
|---|---|---|---|---|---|---|---|---|---|---|
| | Component (A) | Component (B) | Component (C) | of anchor coat layer | Adhesive strength | $O_2$-TR | WV-TR | Adhesive strength | $O_2$-TR | WV-TR |
| Comp. Ex. 7 | Two-component curable adhesive (AC6) | | | $3.8 \times 10^1$ | 265 | 0.3 | 0.4 | 50 | 2.4 | 8.2 |
| Comp. Ex. 8 | — | — | — | — | 85 | 0.4 | 0.8 | delamination | — | — |

Unit of elastic modulus: $N/mm^2$, Unit of adhesive strength: g/15 mm, $O_2$-TR: Oxygen gas permeability ($cc/m^2 \cdot$ 24 brs.), WV-TR: Water vapor permeability ($g/m^2 \cdot$ 24 hrs.)

Example 13

On one side of a 12 μm-thick biaxially oriented poly (ethylene terephthalate) film was applied an anchor coat composition used in Example 6 in a dry thickness of 0.3 μm and the coated film was dried. By the vacuum vapor deposition technique using SiO as the vapor source in a vacuum of $5 \times 10^{-3}$, a 500 Å-thick silicon oxide vapor deposited layer was deposited, as an inorganic layer, on the coated side of the base film to give a composite film.

Applied Examples 1 to 4

On one side of a 12 μm-thick biaxially oriented poly (ethylene terephthalate) film was applied an anchor coat composition used in Example 6 in a dry thickness of 0.3 μm and the coated film was dried. By the vacuum vapor deposition technique using SiO as the vapor source in a vacuum of $5 \times 10^{-3}$, a 500 Å-thick silicon oxide vapor deposited layer was deposited, as an inorganic layer, on the coated side of the base film.

A vinylidene chloride-based copolymer (Asahi Chemical Industry Co., Ltd., trade name: Saran Resin F 216) was dissolved in a mixed solvent of toluene-tetrahydrofuran (½, by weight) to prepare a coating composition of 15% by weight resin concentration. This coating composition was coated in a dry thickness of 0.5 $g/m^2$ (Applied Example 1, thickness about 0.3 μm), 1.0 $g/m^2$ (Applied Example 2, thickness about 0.6 μm), 2.0 $g/m^2$ (Applied Example 3, thickness about 1.2 μm) and 3.0 $g/m^2$ (Applied Example 4, thickness about 1.8 μm) on the inorganic layer obtained above.

The gas permeability and water vapor permeability of the composite films each obtained in Example 13 and Applied Examples 1 to 4 were determined for before and after retort treatment at 120° C. for 30 minutes. The results are shown in Table 2.

5,000 Å formed on said coat layer, wherein said coat layer comprises 100 parts by weight of (A) a noncrystalline thermoplastic chlorine-containing resin having a glass transition temperature of 25° to 60° C. and an acid value of 0 to 30 mg KOH/g, 10 to 500 parts by weight of (B) a polyisocyanate compound having at least two isocyanate groups per molecule with a molecular weight of 150 to 1,000, and 1 to 50 parts by weight of (C) a noncrystalline saturated polyester resin having a glass transition temperature of −10° to 20° C., a number average molecular weight of $1 \times 10^4$ to $5 \times 10^4$, a hydroxyl value of 0 to 15 mg KOH/g or an acid value of 0 to 10 mg KOH/g and being substantially unreactive to the polyisocyanate compound.

2. A barrier composite film as claimed in claim 1, wherein said chlorine-containing resin is a vinyl chloride-vinyl acetate-series copolymer containing at least vinyl chloride and vinyl acetate as monomer components.

3. A barrier composite film as claimed in claim 1, wherein said polyisocyanate compound (B) is a compound having three or more isocyanate groups per molecule with a molecular weight of 150 to 1,000.

4. A barrier composite film as claimed in claim 1, wherein said noncrystalline saturated polyester resin (C) has a hydroxyl value of 0 to 10 mg KOH/g or an acid value of 0 to 10 mg KOH/g.

5. A barrier composite film as claimed in claim 1, wherein the number average molecular weight of the noncrystalline saturated polyester resin (C) is $1 \times 10^4$ to $3 \times 10^4$.

6. A barrier composite film as claimed in claim 1, wherein said coat layer comprises, relative to 100 parts by weight of the chlorine-containing resin (A), 25 to 400 parts by weight of the polyisocyanate compound (B) and 2 to 50 parts by weight of the noncrystalline saturated polyester resin (C).

7. A barrier composite film as claimed in claim 1, wherein said coat layer comprises 100 parts by weight of (A) a noncrystalline thermoplastic chlorine-containing resin having a glass transition temperature of 25° to 60° C. and an

TABLE 2

| | | Before retort treatment | | After retort treatment | |
|---|---|---|---|---|---|
| | Barrier resin layer ($g/m^2$) | Oxygen gas permeability ($cc/m^2 \cdot$ 24 hr) | Water vapor permeability ($g/m^2 \cdot$ 24 hr) | Oxygen gas permeability ($cc/m^2 \cdot$ 24 hr) | Water vapor permeability ($g/m^2 \cdot$ 24 hr) |
| Example 13 | — | 0.4 | 0.6 | 1.2 | 4.6 |
| Appl. Ex. 1 | 0.5 | 0.03 | 0.2 | 0.6 | 2.8 |
| Appl. Ex. 2 | 1.0 | 0.01 | 0.3 | 0.8 | 1.8 |
| Appl. Ex. 3 | 2.0 | 0.02 | 0.3 | 0.6 | 1.2 |
| Appl. Ex. 4 | 3.0 | 0.01 | 0.3 | 0.4 | 2.1 |

We claim:

1. A barrier composite film comprising a base film layer, a coat layer formed on at least one side of said base film layer, and an inorganic layer having a thickness of 100 to 5,000 Å formed on said coat layer, wherein said coat layer comprises 100 parts by weight of (A) a noncrystalline thermoplastic chlorine-containing resin having a glass transition temperature of 25° to 60° C. and an acid value of 0 to 30 mg KOH/g, 25 to 400 parts by weight of (B) a polyisocyanate compound having three or more isocyanate groups per molecule with a molecular weight of 150 to 1,000, and 2 to 50 parts by weight of (C) a noncrystalline saturated polyester resin having a glass transition temperature of 0° to 20° C., a number average molecular weight of $1 \times 10^4$ to $3 \times 10^4$, and hydroxyl value of 0 to 10 mg KOH/g or an acid value of 0 to 10 mg KOH/g.

8. A barrier composite film as claimed in claim 1, wherein said base film layer comprises a polypropylene, a poly (alkylene terephthalate) or a polyamide.

9. A barrier composite film as claimed in claim 1, wherein said inorganic layer is transparent to visible light.

10. A barrier composite film as claimed in claim 1, wherein said inorganic layer is formed with at least one metal oxide selected from the group consisting of Group 2A elements, transition elements, Group 2B elements, Group 3B elements, Group 4B elements and Group 6B elements of Periodic Table of the Elements.

11. A barrier composite film as claimed in claim 1, wherein said inorganic layer is formed with an oxide of a Group 3B element or Group 4B element of Periodic Table of the Elements.

12. A barrier composite film as claimed in claim 1, wherein said inorganic layer is formed with a silicon oxide.

13. A barrier composite film as claimed in claim 1, wherein said film comprises a polypropylene, poly(alkylene terephthalate) or polyamide base film layer, a coat layer, an electrically nonconductive inorganic layer formed from a silicon oxide of the composition formula SiOx (where $0<x\leq2$) in a thickness of 100 to 5,000 Å and having transparency to visible light, said coat layer and inorganic layer being formed in the order mentioned on at least one surface of said base film layer, and said coat layer comprises (A) a substantially unreactive chlorine-containing resin having a glass transition temperature of 30° to 60° C., (B) a low molecular weight polyisocyanate compound having 3 or more isocyanate groups per molecule, and (C) a substantially unreactive saturated polyester resin having a glass transition temperature of 0° to 15° C. and a number average molecular weight of $1 \times 10^4$ to $5 \times 10^4$.

14. A barrier composite film comprising a base film layer, a coat layer formed on at least one surface of said base film layer, and an inorganic oxide layer formed on said anchor coat layer, wherein said coat layer comprises 100 parts by weight of (A) a noncrystalline thermoplastic chlorine-containing resin having a glass transition temperature of 25° to 60° C. and an acid value of 0 to 30 mg KOH/g, 10 to 500 parts by weight of (B) a polyisocyanate compound having at least two isocyanate groups per molecule with a molecular weight of 150 to 1,000, and 1 to 50 parts by weight of (C) a noncrystalline saturated polyester resin having a glass transition temperature of $-10°$ to 20° C., a number average molecular weight of $1 \times 10^4$ to $5 \times 10^4$, a hydroxyl value of 0 to 15 mg KOH/g or an acid value of 0 to 10 mg KOH/g and being substantially unreactive to the polyisocyanate compound, and wherein the elastic modulus of said coat layer is $0.1 \times 10^1$ to $1 \times 10^3$ N/mm².

15. A barrier composite film comprising a base film layer, a coat layer formed on at least one surface of said base film layer, and an inorganic oxide layer formed on said coat layer, wherein said coat layer comprises 100 parts by weight of (A) a noncrystalline thermoplastic chlorine-containing resin having a glass transition temperature of 25° to 60° C. and an acid value of 0 to 30 mg KOH/g, 10 to 500 parts by weight of (B) a polyisocyanate compound having at least two isocyanate groups per molecule with a molecular weight of 150 to 1,000, and 1 to 50 parts by weight of (C) a noncrys- talline saturated polyester resin having a glass transition temperature of $-10°$ to 20° C., a number average molecular weight of $1 \times 10^4$ to $5 \times 10^4$, a hydroxyl value of 0 to 15 mg KOH/g or an acid value of 0 to 10 mg KOH/g and being substantially unreactive to the polyisocyanate compound, and wherein said coat layer has a peel strength with respect to the base layer of not less than 100 g/15 mm as determined after retort treatment at a temperature of 120° C. for 30 minutes.

16. A barrier composite film as claimed in claim 15, wherein said composite film shows an oxygen gas permeability of not greater than 5 cc/m².24 hr., and a water vapor permeability of not greater than 10 g/m².24 hr. after retort treatment at a temperature of 120° C. for 30 minutes as determined with a base film layer thickness of 10 to 30 µm and a thickness of covering layer comprising the coat layer and the inorganic layer of 0.1 to 0.5 µm.

17. A barrier composite film as claimed in claim 15, wherein said noncrystalline saturated polyester resin (C) is formed with a resin composition having an elastic modulus of $1 \times 10^1$ to $5 \times 10^2$ N/mm².

18. A barrier composite film comprising a base film layer, a coat layer formed on at least one side of said base film layer, and an inorganic layer having a thickness of 100 to 5,000 Å formed on said coat layer, wherein said coat layer comprises 100 parts by weight of (A) a noncrystalline thermoplastic chlorine-containing resin having a glass transition temperature of 25° to 60° C. and an acid value of 0 to 30 mg KOH/g, 25 to 400 parts by weight of (B) a polyisocyanate compound having three or more isocyanate groups per molecule with a molecular weight of 150 to 1,000, and 2 to 50 parts by weight of (C) a noncrystalline saturated polyester resin having a glass transition temperature of 0° to 20° C., a number average molecular weight of $1 \times 10^4$ to $3 \times 10^4$, a hydroxyl value of 0 to 10 mg KOH/g or an acid value of 0 to 10 mg KOH/g and being substantially unreactive to the polyisocyanate compound (B).

19. A barrier composite film comprising a base film layer, a coat layer formed on at least one side of said base film layer, and an inorganic layer having a thickness of 100 to 5,000 Å formed on said coat layer, wherein said coat layer comprises (A) a vinyl chloride-vinyl acetate-series copolymer containing at least vinyl chloride and vinyl acetate as monomer components, (B) a polyisocyanate compound and (C) a saturated polyester resin having a glass transition temperature of $-10°$ C. to 20° C. and being substantially unreactive to the polyisocyanate compound.

20. A method of producing a barrier composite film which comprises forming an coat layer comprising 100 parts by weight of (A) a noncrystalline thermoplastic chlorine-containing resin having a glass transition temperature of 25° to 60° C. and an acid value of 0 to 30 mg KOH/g, 10 to 500 parts by weight of (B) a polyisocyanate compound having at least two isocyanate groups per molecule with a molecular weight of 150 to 1,000, and 1 to 50 parts by weight of (C) a noncrystalline saturated polyester resin having a glass transition temperature of $-10°$ to 20° C., a number average molecular weight of $1 \times 10^4$ to $5 \times 10^4$, a hydroxyl value of 0 to 15 mg KOH/g or an acid value of 0 to 10 mg KOH/g and being substantially unreactive to said polyisocyanate compound on at least one surface of a base film layer, and depositing an inorganic layer on said coat layer.

* * * * *